United States Patent [19]

Godejahn, Jr.

[11] 4,221,045
[45] Sep. 9, 1980

[54] SELF-ALIGNED CONTACTS IN AN ION IMPLANTED VLSI CIRCUIT

[75] Inventor: Gordon C. Godejahn, Jr., Santa Ana, Calif.

[73] Assignee: Rockwell International Corporation, El Segundo, Calif.

[21] Appl. No.: 913,184

[22] Filed: Jun. 6, 1978

[51] Int. Cl.³ .............................................. B01J 17/00
[52] U.S. Cl. .................................. 29/571; 29/577 R; 29/578; 29/589; 29/590; 357/23; 357/41; 357/59
[58] Field of Search .................. 29/571, 577, 578, 589, 29/590, 591; 357/23, 41, 59

[56] References Cited
U.S. PATENT DOCUMENTS 4,072,545  2/1978  De La Moneda ..................... 357/59

Primary Examiner—W. C. Tupman
Attorney, Agent, or Firm—H. Fredrick Hamann; Harry J. Staas

[57] ABSTRACT

A process for producing VLSI (very large scale integrated) circuits employs techniques of self-aligned gates and contacts for FET devices and for both diffused conducting lines in the substrate and polysilicon conducting lines situated on isolating field oxide formed on the substrate. Mask alignment tolerances are increased and rendered non-critical. The use of materials in successive layers having different etch characteristics permits selective oxidation of only desired portions of the structure without need for masking and removal of selected material from desired locations by batch removal processes again without use of masking. There results VLSI circuits having increased density and reliability. The process allows the simultaneous doping of two or more regions resulting in uniformity of device characteristics.

20 Claims, 14 Drawing Figures

SELF-ALIGNED CONTACTS IN AN ION IMPLANTED VLSI CIRCUIT

BACKGROUND OF THE INVENTION

1. Field of the Invention

The invention relates to the field of semiconductor device fabrication techniques and more particularly to the field of fabrication techniques for the fabrication of very large scale integrated circuits (VLSI) having increased density and reliability and containing FET devices, polysilicon and diffused interconnect lines, and metallized interconnect lines interfacing with the polysilicon and diffused lines.

2. Prior Art

The semiconductor art has been concerned with reducing the size and power consumption of individual devices and integrated circuits in order to increase the logic power of these circuits per unit area. A particular effort has been extended in the area of monolithic radom access memories (RAM's) and read only memories (ROM's) having very large memory capacity. Many things have been done over the years on an attempt to reduce the size of devices and improve tolerances with which they are fabricated. Such efforts have included, inter alia, fine line lithography, improved mask generation and alignment machines, improved tolerances on mask alignment, and self-aligned gates. These techniques have reduced the area required for the fabrication of the individual FET devices used in these integrated circuits. However, because of alignment tolerances, the FET devices must be designed with larger geometry than they would have to be if perfect mask alignment were obtained. Furthermore, because of alignment tolerances, the FET devices must be spaced further apart than otherwise necessary in order to allow for the misalignment in the formation of the interconnection lines. Consequently, there is a need for an improved integrated circuit fabrication technique for producing VLSI circuits including FET devices and conducting lines having reduced sensitivity to mask alignment.

SUMMARY OF THE INVENTION

In a process in accordance with the invention, both the gate oxide layer of the active FET devices of the integrated circuit as well as a silicon nitride layer are formed on the surface of a silicon substrate. Both layers are surrounded by a field oxide layer and simultaneously formed on areas in which diffused conducting lines are to be formed. A polysilicon layer formed on the nitride layer, is delineated to provide the polysilicon conductor of the gates of the FET devices as well as being delineated for additional interconnection lines and then may be partially oxidized in reliance on the masking effect on the nitride layer. This affords minimal oxide layer thickness on the gate polysilicon layer and again contributes to the reduced device size. Subsequently, silicon nitride, silicon oxynitride, silicon dioxide, and photoresist layers are then employed in various masking and selective etch processes to provide self-aligned gates and contacts for FET devices and self-aligned interconnection interfaces. The fact that silicon nitride, silicon oxynitride, silicon dioxide, photoresist, and silicon all have different etch removal rates when exposed to various etching processes makes it feasible to reduce the number of masking steps needed in comparison to prior art methods and further allows self-alignment features not previously obtainable. In addition, the method described below in accordance with the present invention allows the simultaneous doping of the source, drain and diffused line regions via an ion implantation process. This is advantageous in that the resulting integrated circuit device has more uniform characteristics, and there are no discontinuities at the interfaces of diffused lines and source/drain regions.

The process of the present invention provide a floating gate contact configuration, and the diffused conducting lines permit a first level interconnect to source and drain regions as well as a remote gate contact with direct source and drain contacts.

These and other objects and advantages of the invention will be apparent from the following detailed description of certain preferred embodiments thereof.

DESCRIPTION OF THE PREFERRED EMBODIMENT

Figure 1:
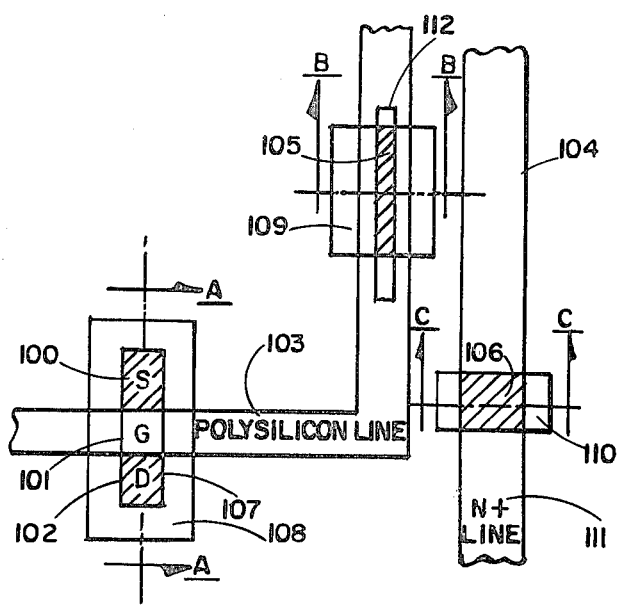
FIG. 1 illustrates a partial plan view of the surface of a semiconductor wafer processed in accordance with the present invention. Additionally illustrated in this drawing figure are the outlines of the protective regions of the various masks used in the process in accordance with the present invention.
Figure 2:
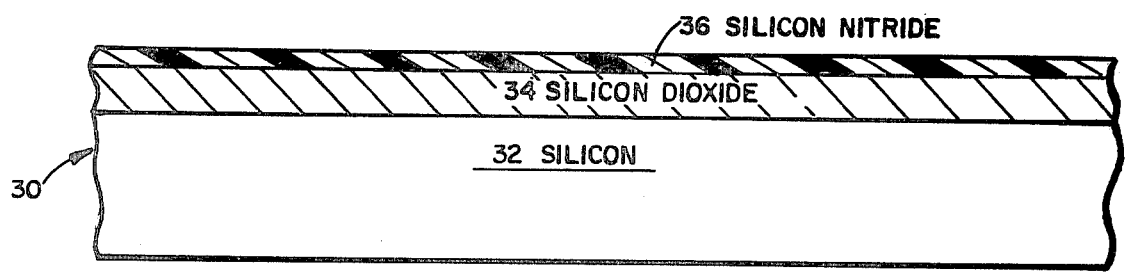
FIGS. 2–12 are partial cross-sectional views, illustrating in a chronological sequence the semiconductor wafer after being subjected to the various process steps in accordance with the present invention.

FIG. 1 illustrates a partial plan view of a preferred embodiment of the present invention. A field effect transistor having a source region 100, a gate region 101 and a drain region 102 is illustrated in the left portion of the figure. A polysilicon line 103 is illustrated as being L shaped and extending through the field effect transistor. In addition, a PC contact 105 is illustrated as being part of the polysilicon line 103. And N+ diffused line 104 is also illustrated, and is shown having an N+ contact region 106. Also illustrated are the outlines of the mask regions of four of the masks used in processing a semiconductor wafer in accordance with the present invention. Namely, FIG. 1 illustrates PC mask region 112, C mask regions 108-110, N mask regions 107 and 111, and G mask region 113. Lastly, section lines A—A, B—B, C—C, illustrated in FIG. 1, correspond to regions 120, 121, and 122 of FIGS. 2 through 14.

A process in accordance with a preferred embodiment of the present invention starts with a wafer 30 of (100 oriented) P-type monocrystalline silicon 32. It is of course, understood that N-type silicon could be substituted for the P-type silicon. Furthermore, while bulk silicon is illustrated, it is understood that composite substrates (e.g., slicon on sapphire) could be substituted.

A thermal silicon dioxide layer 34 is grown on the entire surface of the wafer, typically to a depth of 800 Å. A silicon nitride layer 36 is then deposited over the entire wafer, typically to a depth of 600 Å. Portions of these two layers, along with a subsequently formed silicon oxynitride layer will eventually become the gate insulator regions of the field effect transistors to be fabricated on the wafer 32. The wafer at the end of this step is illustrated in cross-section in FIG. 2.

Figure 3:
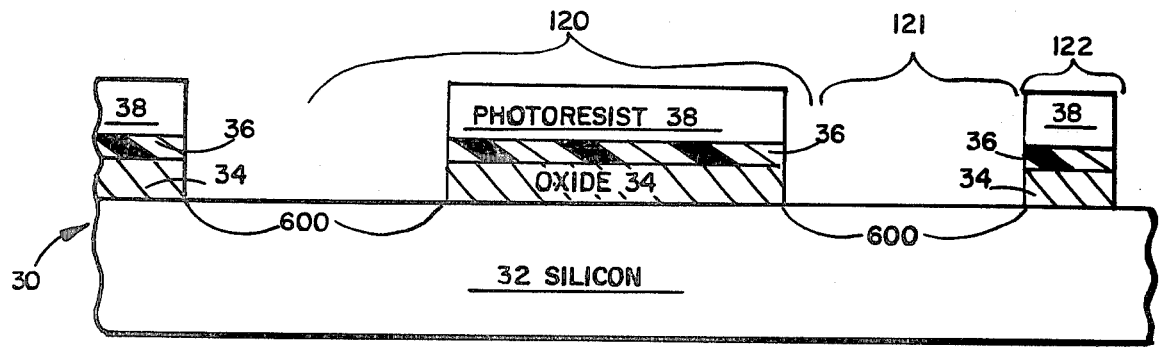

A layer of photoresist 38 is then disposed on the silicon nitride layer 36 and exposed to actinic radiation through the N mask having protective regions 107 and 111 (illustrated in FIG. 1) wherever no field oxide is desired, (i.e., where active devices or diffused lines are to be formed in the substrate). Mask region 107 is over the future location of a field effect transistor while mask region 111 is over a future N+ diffused interconnect line. The protective regions 107 and 111 of the N mask are opaque or transparent in accordance with the type of photoresist utilized and result in the photoresist thereunder being rendered non-soluble while the remainder of the photoresist is rendered soluble. After the exposure of the photoresist layer 38, the photoresist layer 38 is developed so as to remove the soluble portions thereof, leaving portions corresponding to the protective regions 107 and 111. The portions of the silicon nitride layer 36 which are left unprotected by the removal of a soluble photoresist layer 38 are removed in an appropriate manner (e.g.,—nitride etching process). The photoresist protects the portions of the silicon nitride layer thereunder. The portions of the silicon dioxide layer 34 which have been uncovered by the removal of the unprotected portions of the silicon nitride layer 36 are next removed in an appropriate manner (e.g.,—oxide etching process) and the wafer appears in cross-section as illustrated in FIG. 3. Accordingly, the bare surface of the silicon 32 is exposed in regions 600.

The wafer is then subjected to an implant process used to implant dopant ions into the areas of the substrate wherein the field oxide is to be grown. While not mandatory in all cases, the use of this implant helps prevent dopant inversion in the substrate and is therefore advisable. The remaining portions of the photoresist layer 38 serve as a shield to prevent the dopant ions from entering the regions wherein active devices and N+ diffused lines are to be located.

Figure 4:
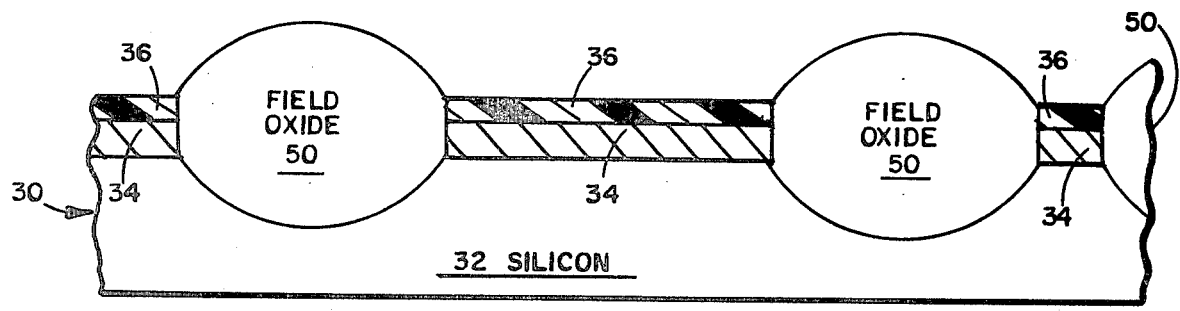

The remaining photoresist layer 38 is removed from the wafer 30 and the wafer then exposed to thermal oxidization conditions to grow a field oxide 50 to a depth of between 6000 and 12000 Å on those portions of the wafer surface which are not protected by the silicon nitride layer 36. FIG. 4 illustrates a cross-section of the wafer after being subjected to the thermal oxidization process. The silicon nitride prevents the underlying silicon 30 from being oxidized. The same thermal oxidation process that forms the field oxide 50, also forms a thin (e.g.—100 Å) layer of silicon oxynitride on the surface of the silicon nitride layer 36. However, this thin oxynitride layer has been omitted from the drawing figures for clarity.

A polysilicon layer 60 is then deposited on the silicon oxynitride layer atop the nitride layer 36 and the field oxide region 50, typically to a depth of 8000 Å. This polysilicon layer 60 is of the doped N-type variety and typically may be doped with arsenic or phosphorous dopant ions. The polysilicon layer 60 will eventually be delineated so as to form the gate electrode 101 and polysilicon line 104.

The wafer 30 is then subjected to a thermal oxidization process to grow a silicon dioxide layer 62 on the surface of the poly-silicon layer 60, typically to a depth of 1000 Å.

Figure 5:
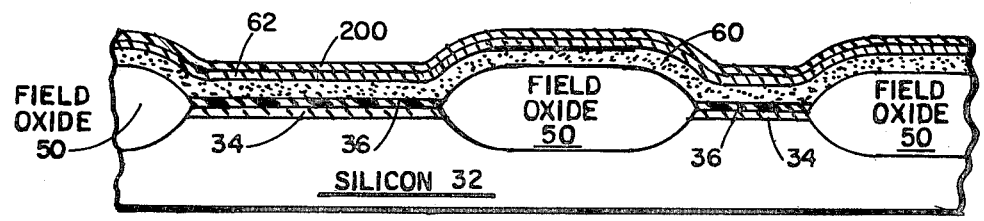

A second silicon nitride layer 200 is then applied over the silicon dioxide layer 62, typically to a depth of 400 Å. FIG. 5 illustrates a cross-sectional view of the wafer 30 after the application of the second silicon nitride layer 200. The nitride layer 200 will be ultimately used to protect the poly-silicon layer 60 from oxidation over the region where the polysilicon contact 105 will be formed.

A photoresist layer is then applied over the surface of the second silicon nitride layer 200 and exposed to actinic radiation through the PC mask. The PC mask contains a protective portion 112, as illustrated in FIG. 1, which corresponds to the region on the surface of the wafer 30 wherein the PC polysilicon contact 105 to the polysilicon line 103 will be made. As illustrated in FIG. 1, note that the PC contact 105 is considerably smaller than the PC mask 112, and is thinner than the polysilicon line 103. The PC mask portion 112 is made thin so as not to interfere with the N+ diffused line, adjacent thereto, during the subsequent ion implant process.

After removing the unwanted photoresist layer using a conventional developer solution, the second silicon nitride layer 200 is removed using an appropriate process (e.g.—nitride etch process) over the entire surface of the wafer 30 except for the region protected by the remaining photoresist delineated by the PC mask region 112. Thus, a nitride button or stripe, having the shape of the PC mask 112, is formed from the second nitride layer and is juxtaposed over the polysilicon line 103.

Figure 6:
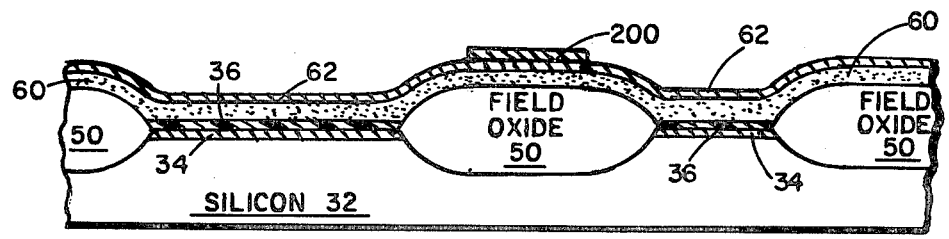

The remaining photoresist portion is then removed using conventional techniques and a cross-section of the wafer appears as illustrated in FIG. 6.

A new layer of photoresist is then applied to the surface of the wafer 30 and exposed to actinic radiation through the G mask. The G mask contains a protective region 113 which corresponds to the location wherein the polysilicon line 103 and gate region 101 of the field effect transistor are to be located.

The unwanted photoresist layer is then removed and the wafer 30 subjected to an oxide removal process (e.g.—etching process) to remove the silicon dioxide layer 62 from the entire surface of the wafer 30 except for the portion juxtaposed beneath the photoresist portion delineated by the G mask region 113.

Figure 7:
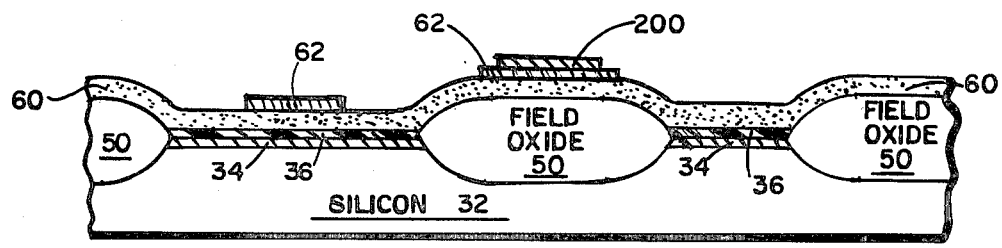

The photoresist portion is then removed and a cross-section of the wafer would appear as illustrated in FIG. 7.

Referring to FIG. 1, and FIG. 7, note that the G mask region 113 is larger than the PC mask region 112 and the N mask 107. Because of this, the alignment tolerance of the G mask is not particularly critical. It is merely necessary to position the G mask region 113 so as to be approximately centered over the N mask region 107 and to ensure that the G mask region 113 covers substantially all of the PC mask region 112. The noncritically of the G mask alignment invariably results in a greater device yield, thus reducing the per unit cost of the integrated circuits produced in accordance with the present invention.

Figure 8:
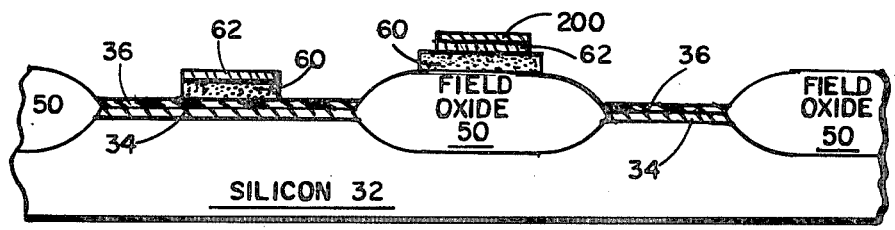
Figure 9:
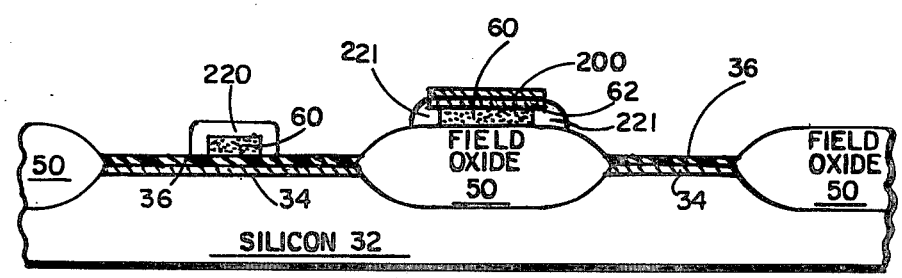

The polysilicon layer 60 is then removed from the surface of the wafer 30 except at those regions protected by the L shaped silicon dioxide layer 62 delineated by the G mask region 113 (i.e.—polysilicon line region 103). A cross-section of the resultant wafer then appears as illustrated in FIG. 8.

The wafer is then subjected to a thermal oxidation process which produces a thick oxide layer (e.g.—5000 Å) on the exposed polysilicon line 103 except for the portion of the polysilicon line 103 covered by the silicon nitride "button" 200. As illustrated in the cross-sectional view of FIG. 9, the silicon dioxide region 220 covers the entire polysilicon layer region 60 which will eventually serve as the polysilicon line 103 and gate region 101. Where the polysilicon layer region 60 is covered by the silicon nitride button 200, (i.e.—where the PC polysilicon contact is to be located), areas of thermally grown silicon dioxide 221 are formed around the circumference of the button and on the sides of the polysilicon layer region 60. The exposed field oxide regions 50 are also grown to a further extent by this thermal oxidation process. However, this is of little consequence. The areas under the silicon nitride layer 36 are again protected from oxidation. As noted above with respect to the earlier thermal oxidation process, the exposed portions of the silicon nitride layer 36 and button 200 grow a thin layer of silicon oxynitride thereon due to the thermal oxidation process. For clarity, this thin oxynitride layer has again been omitted from the drawing figures.

The wafer is then subjected to an ion implant process for doping the source region 100, drain region 102, N+ diffused line region 104, and PC polycontact region 105. Typically, a 400 KeV implanter is necessary to obtain ion implant dosages of phosphorus or arsenic ions on the order of $10^{16}$ ions/cm$^2$. The only regions not to be doped by this high energy implant process are those regions covered by a thick silicon dioxide layer, namely, the areas under the field oxide regions 50 and the polysilicon line 103 except where the PC polysilicon contact 105 is to be located. However, the polysilicon layer 60, used to form the polysilicon line, is of the doped variety and it is therefore unnecessary for the polysilicon line 103 to again be redoped. It is important to point out that the implant process has simultaneously implanted the source, drain, and N+ diffused line regions. This enables device uniformity on the wafer and further eliminates discontinuities at the interfaces between N+ diffused lines and the sources and drains. This lack of discontinuities is important since N+ diffused lines are often used to interconnect field effect devices on a VLSI wafer.

The wafer may then optionally be subjected to an annealing process to stabilize the effects of the ion implantation. While optional, it has been found to be desirable to perform this annealing process.

A layer of photoresist 225 is then applied to the wafer 30 and exposed to actinic radiation through the C mask containing protective regions 108–110. As noted in FIG. 1, protective region 108 entirely covers the area wherein the field effect transistor, having source region 100, gate region 101, and drain region 102, is to be located. C mask region 109 is wider than the polysilicon line 103 delineated by the G mask region 113 but may be narrower than the PC mask 112. The protective C mask region 110, used to delineate the N+ contact 106, is wider than the N+ line 104 delineated by the N mask region 111. Note that the C mask does not require critical alignment since C mask protective portion 108 can be made considerably larger than the field effect device to be protected; the protective C mask region 109 merely has to be positioned so as to substantially cover a portion of the PC contact region 105 delineated by the PC protective region 112; the C mask protective region 110 must merely cross the N+ line 104 to delineate the N+ contact region 106. Thus, the process in accordance with the present invention enables noncritical mask alignment tolerances.

Figure 10:
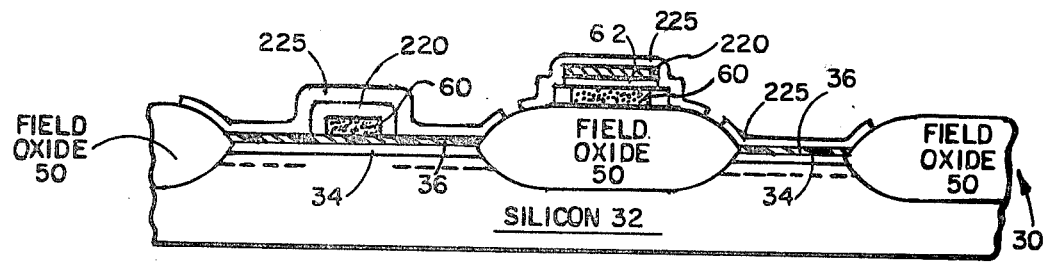

FIG. 10 illustrates a cross-sectional view of the wafer after the unwanted resist regions of photoresist layer 225 have been removed using a conventional removal process. Note that portions of the photoresist layer 225 protect the areas to become the field effect transistor, PC polysilicon line contact 105, and N+ contact 106. The cross-section of the N+ line 104 is not illustrated. However, it would appear identical to the N+ contact in region 122 as illustrated in FIG. 10 with the exception that there would be no photoresist layer 225 atop the silicon nitride layer 36.

The wafer 30 is then subjected to sequential oxynitride and nitride removal processes (e.g. etching processes) to remove the exposed oxynitride layer (not illustrated) and silicon nitride layer 36 covering the N+ diffused interconnection line 104 and the silicon nitride layer 200 over polysilicon line 103 except for the regions protected by the photoresist layer 225 delineated by masks 109 and 110.

The remaining portions of the photoresist layer 225 are then removed. By this process, we have now formed self aligned nitride/oxynitride buttons over the intended source contact 100, drain contact 102, PC polysilicon line contact 105, and N+ contact 106. The protected regions underneath these oxynitride/nitride buttons have been formed by the intersection of two or more protective mask regions with the process arranged so as to insure that the positional alignment tolerances for each mask is relatively non-stringent.

Figure 11:
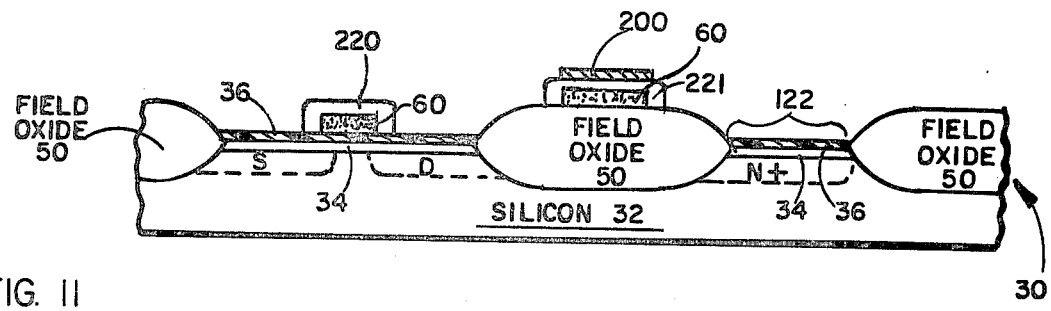

The wafer 30 is then subjected to an oxidation process to oxidize the N+ line 104 and further oxidize the polysilicon line 103. However, the areas under the oxynitride/nitride buttons are protected against oxidation. Furthermore, the thermal oxidation process serves to further diffuse the dopant ions implanted in the ion implantation process into the N+ diffused line 104 and the source and drain regions 100 and 102. FIG. 11 illustrates cross-sectional view of the wafer after having undergone the oxidation process.

Figure 12:
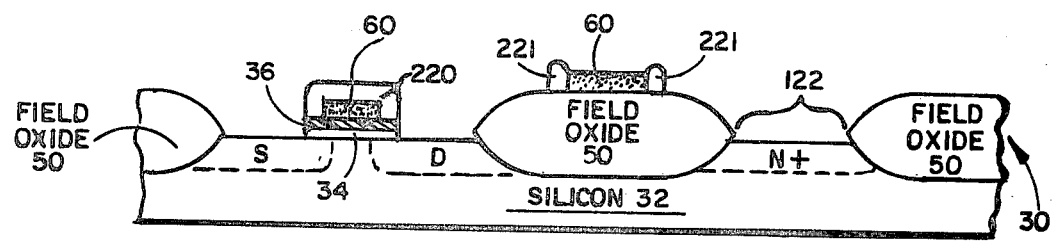

The wafer 30 is then subjected to sequential oxynitride, nitride, and oxide batch removal processes to remove the oxynitride/nitride buttons and the portions of the silicon dioxide layers 34 and 62 juxtaposed thereunder. FIG. 12 illustrates a cross-sectional view of the wafer after having undergone the three sequential batch removal processes. Note that the source 100, drain 102, PC polysilicon contect 105, and N+ diffused line contact 106 are now all exposed. Also note that they have been exposed by batch removal processes without requiring any additional masking steps with their inherent critical positional alignment tolerances. Thus, this process has enabled the fabrication of truly self aligned contacts to the source, drain, polysilicon line, and N+ line.

There are then two alternative groups of steps which may be performed on the wafer. They are as follows:

Alternative 1

A metallization layer 400 is applied to the surface of the wafer 30. This metallization layer 400 may consist of a metal (e.g.—aluminum) or may consist of a doped polysilicon layer.

A layer of photoresist is then applied and subjected to actinic radiation through a M mask which defines the interconnect lines to be formed from the metallization layer 400. The M mask does not require critical positional alignment since, as illustrated in FIG. 1, all of the contact regions to be interfaced with portions of the metallization layer 400 are surrounded by insulating regions. As illustrated in FIG. 12, the region between the source and the drain is protected by the silicon dioxide layer 220 formed over the polysilicon line 103; the PC polysilicon contact region 105 is protected by the silicon dioxide regions 221 and the field oxide region 50, and the N+ interconnect line 104 is between two field oxide regions 50.

Figure 13:
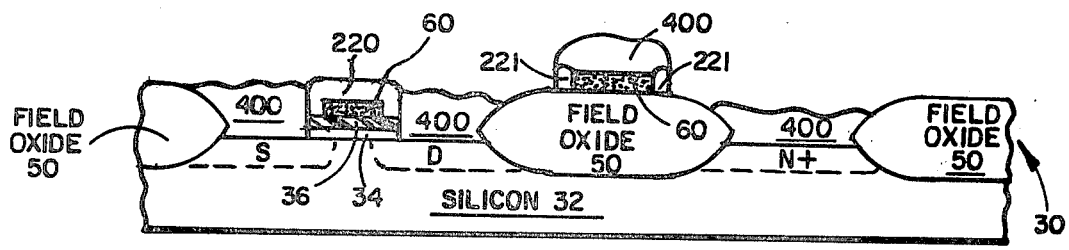
FIG. 13 illustrates a partial cross-sectional view of a semiconductor wafer processed in accordance with the present invention after having been processed in accordance with the additional steps enumerated in Alternative 1.

The unwanted metallization layer 400 is then removed and the wafer 30 subjected to the usual final passivation and cleaning processes. FIG. 13 illustrates the wafer after the unwanted portions of the metallization layer and remaining photoresist have been removed.

Alternative 2

A layer of Silox 401 is applied to the surface of the wafer 30. The Silox is either doped or undoped depending upon whether or not one wishes to additionally dope the exposed contacts. If the Silox is doped, a dopant drive process is performed prior to the following steps.

A photoresist layer is applied on top of the Silox layer 401 and exposed to actinic radiation through an additional C mask. The purpose of this additional C mask is merely to delineate windows through the Silox layer so as to expose the contacts. As in the other masking processes, the positional alignment tolerance of the C mask is not critical since it is merely necessary to expose substantial portions of the contacts.

Figure 14:
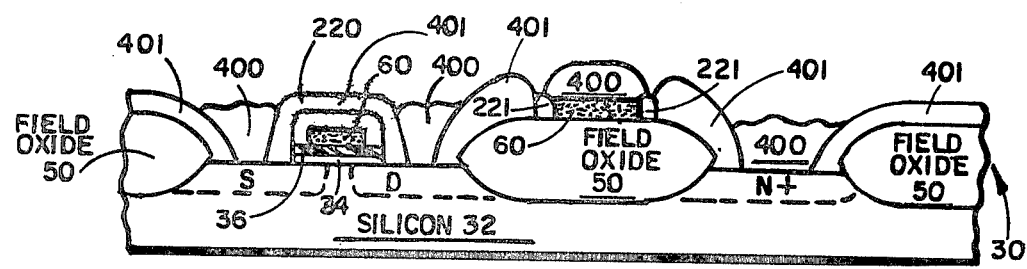
FIG. 14 illustrates a partial cross-sectional view of a semiconductor wafer processed in accordance with the present invention after having been subjected to the additional steps enumerated in Alternative 2.

The wafer is then subjected to conventional photoresist removal and Silox removal processes and the resultant wafer is then subjected to the metallization processes indicated above in Alternative 1. FIG. 14 illustrates a cross-sectional view of the wafer after being subjected to the metallization and M masking steps. Note that the Silox layer 401 provides an additional measure of protection (i.e.—electrical insulation) between the contact regions and further serves to additionally passivate the surface of the wafer 30. As illustrated with respect to the source and drain regions, note that the window through the Silox 401 does not have to expose the entire contact region. Thus, as indicated above, the C mask used to delineate these contact windows does not require critical positional mask alignment tolerances.

These and other modifications and adaptations of the process and resulting structures and integrated circuits in accordance with this invention as disclosed herein will be apparent to those of skill in the art, and thus it is intended by the appending claims to cover all such modifications and adaptations which fall within the true spirit and scope of the invention.

I claim:
1. A process for forming very large scale integrated circuits on a monocrystalline silicon semiconductor substrate comprising the steps of thermally growing a first silicon dioxide layer on a first surface of said silicon semiconductor substrate,
   selectively applying a first silicon nitride layer on said first silicon dioxide layer, said first silicon nitride layer being applied at least in a first selected area in which a field effect semiconductor device is to be formed and in at least a second selected area in which a diffused conducting line is to be formed,
   thermally oxidizing said silicon semiconductor substrate whereby thick field oxide regions are grown surrounding said first and second selected areas whereby said first silicon nitride layer substantially prevents the growth of additional silicon dioxide regions in said portions of said silicon substrate thereunder and whereby said thermal oxidation forms a thin silicon oxynitride layer on the surface of said first silicon nitride layer,
   forming a polysilicon layer on the surface of said silicon oxynitride layer and said field oxide region, said polysilicon layer extending over said selected areas,
   forming a second silicon dioxide layer on top of said polysilicon layer,
   selectively applying a silicon nitride stripe on said second silicon dioxide layer juxtaposed on one of said field oxide regions,
   selectively removing portions of said second silicon dioxide layer and said polysilicon layer to define a polysilicon gate electrode extending transversely and centrally of said selective area for said active device and to define a polysilicon line traversing at least one of said field regions, the surface of said polysilicon layer covered by portions of said second silicon dioxide layer and said silicon nitride stripe, said polysilicon line having a width greater than that of said silicon nitride stripe in the area immediately surrounding said silicon nitride stripe,
   oxidizing said polysilicon gate electrode and line, covered with said second silicon dioxide layer, to form a thick third silicon dioxide layer thereon, whereby said first silicon nitride layer and said silicon nitride button substantially prevent the formation of silicon dioxide thereunder,
   selectively removing portions of said first silicon nitride layer and said silicon stripe, wherein the remaining portions thereof define areas on the surface of said silicon semiconductor substrate to become the source and drain contacts of said field effect device, the polysilicon line contact and the diffused line contact,
   thermally oxidizing the surface of the diffused line and the polysilicon line, whereby said first silicon nitride layer and said silicon nitride stripe protect the polysilicon layer and the silicon semiconductor substrate thereunder from substantially forming a silicon dioxide layer,
   batch removing in sequence the exposed silicon oxynitride, silicon nitride, and silicon oxide layers, whereby said source and drain contacts, polysilicon line contact, and diffused line contact are exposed,
   providing electrical interconnections to said source and drain contacts, polysilicon line contact, and diffused line contact.

2. A process as in claim 1, further comprising the step of:
   implanting dopant ions into the surface of said silicon semiconductor substrate at least in said first and second selected areas by means of an ion implanter, whereby said thick field oxide regions and said thick third silicon dioxide layer prevent the implantation of dopant ions into the surface of said silicon semiconductor substrate thereunder, said implanting step performed after said step of oxidizing said polysilicon electrode and line.

3. A process as in claim 1 or 2, wherein said step of forming a polysilicon layer comprises forming a polysilicon layer including dopant ions therein.

4. A process as in claim 1, wherein said steps of selectively removing respectively, silicon dioxide and silicon nitride portions comprise the steps of:
applying a layer of photoresist, exposing said photoresist layer to actinic radiation through a mask having protective regions thereon, said protective regions opaque to said actinic radiation,
applying a developer to said photoresist layer to dissolve regions thereof, whereby said photoresist layer regions not exposed to said actinic radiation have a substantially different solubility than those regions of said photoresist layer exposed to actinic radiation,
and respectively etching said exposed silicon dioxide and silicon nitride portions, wherein said etching process respectively removes silicon dioxide and silicon nitride without substantially affecting said undissolved photoresist regions, whereby said respective silicon dioxide and silicon nitride juxtaposed under said undissolved photoresist are substantially unaffected by said etching process.

5. A process as in claim 4, wherein said step of selectively applying silicon nitride comprises:
applying a layer of silicon nitride,
selectively removing a portion of said silicon nitride layer.

6. A process for forming very large scale integrated circuits on a monocrystalline silicon semiconductor substrate having field oxide regions surrounding and isolating at least a first selected area in which a field effect semiconductor device is to be formed and at least a second selected area in which a diffused conducting line is to be formed and having polysilicon line conductors disposed on said field oxide and for providing self-aligned contacts to at least selected ones of said conductors comprising the steps of:
thermally growing a first silicon dioxide layer on each of said first and second selected areas,
forming a silicon nitride layer on said first silicon dioxide layer,
forming a silicon oxynitride layer on said first silicon nitride layer,
forming a polysilicon layer on said silicon oxynitride layer extending over said selected areas and said field oxide region,
forming a protective button on said polysilicon layer, juxtaposed over the location of a corresponding said polysilicon line conductor to be formed, and of lesser width than said line,
defining a polysilicon gate electrode extending transversely and centrally of said selected area for said active device, and a polysilicon line conductor, extending at least in part over said field region, of greater width dimension than said button and intersecting same in an intersection region, to be formed from said polysilicon layer,
delineating said polysilicon layer to form said line conductor with said conformed button juxtaposed thereon and to form said gate electrode,
protecting the portions of said first silicon oxynitride and nitride layers on said source and drain regions and on a selected contact area of said diffused conducting line and removing all unprotected portions of said first silicon oxynitride and silicon nitride layers,
removing the silicon dioxide layer portions exposed by removal of said first silicon nitride layer portions,
forming a thermal oxide on exposed surfaces of said gate polysilicon layer, of said polysilicon line conductor, and of said diffused line, and
removing said first silicon oxynitride and nitride layers from said source and drain regions and said diffused conducting line and removing said button, thereby to expose said contact surfaces of said source and drain regions, of said diffused conducting line and of said polysilicon line conductor.

7. A process as recited in claim 6, further comprising a step of providing conductor lines on said semiconductor substrate extending over said field oxide and onto said polysilicon line contact for providing electrical connection thereto.

8. A process as recited in claim 6, wherein said button comprises a silicon nitride layer, and said step of removing said button comprises applying a material to said substrate which selectively removes nitride and has no substantial effect on said insulating thermal oxide.

9. A process as in claim 6, further comprising the step of simultaneously doping said source, drain, and diffused conducting line regions with an ion implant doping means.

10. A process for forming very large scale integrated circuits on a monocrystalline silicon semiconductor substrate having field oxide regions surrounding and isolating at least a first selected area in which a field effect semiconductor device is to be formed and at least a second selected area in which a diffused conducting line is to be formed and having polysilicon line conductors disposed on said field oxide and for providing self-aligned contacts to at least selected ones of said conductors comprising the steps of:
thermally growing a first silicon dioxide layer on each of said first and second selected areas,
forming a first silicon nitride layer on said first silicon dioxide layer, forming a silicon oxynitride layer on said first silicon nitride layer,
forming a polysilicon layer on said silicon oxynitride layer extending over said selected areas of said field oxide region,
forming a second silicon nitride layer on said polysilicon layer,
retaining a selected portion of said second silicon nitride layers overlying said field region as a button having a width dimension smaller than the width of a polysilicon line conductor to be formed from said polysilicon layer on said field region and removing remaining portions of said second silicon oxynitride and silicon nitride layers,
defining a polysilicon gate electrode, extending transversly and centrally of said selected area for said active device, and a polysilicon line conductor, extending at least in part over said field region, of greater width dimension than said button and intersecting same in an intersection region, to be formed from said polysilicon layer,
delineating said polysilicon layer to form said line conductor with said button juxtaposed thereon and to form said gate electrode,
protecting the portions of said first silicon oxynitride and nitride layers on said source and drain regions and on a selected contact area of said diffused conducting line and removing all unprotected portions of said first silicon oxynitride and silicon nitride layers, removing the silicon dioxide layer portions exposed by removal of said first nitride layer portions, forming a thermal oxide on exposed surfaces of said gate polysilicon layer, of said polysilicon line conductor, and of said diffused line, and, in sequence, removing exposed portions of said first oxynitride layer and the thereby exposed portions of said first and second nitride layers, removing the exposed portions of said silicon dioxide layer exposed by removal of said portions of said first silicon nitride layer and any oxide on the exposed contact surface of said polysilicon line conductor, thereby to expose said contact surfaces of said source and drain regions, of said diffused conducting line, and of said polysilicon line conductor.

11. A process as recited in claim 10, further comprising the step of:

prior to the step of protecting the portions of said first silicon oxynitride and nitride layers, simultaneously doping all of said source and drain regions, and said diffused conducting line by ion implant doping.

12. A process for fabricating a field effect semiconductor device having source, drain, and gate regions on a selected area of a first surface of a monocrystalline silicon substrate comprising the steps of:

thermally growing a silicon dioxide layer on said selected area of said first surface of a thickness suitable for the gate insulator layer of said field effect device, forming a first silicon nitride layer on said silicon dioxide layer, forming a first silicon oxynitride layer on said first silicon nitride layer, forming a polysilicon layer on said first silicon oxynitride layer, forming a second silicon nitride layer on said polysilicon layer, removing said second nitride layer except for retaining a gate contact surface defining portion thereof extending transversly of said selected area in the region of a gate to be defined, protecting said retained portion of said second silicon nitride layer while delineating said polysilicon layer to define a gate polysilicon layer electrode extending transversly of said selected area of said active device of lesser width than and in alignment with said retained portion of said second silicon nitride layer, said gate polysilicon layer electrode defining first and second remaining portions of said selected area corresponding to source and drain regions of said device, thermally oxidizing the surface of said gate polysilicon layer electrode while retaining said first silicon nitride and silicon oxynitride layers over said source and drain regions of said active device to prevent formation of any substantial amount of oxide thereon, removing the portions of said first silicon oxynitride layer from said source and drain regions, removing said retained second nitride layer portion from said gate polysilicon layer electrode and simultaneously removing the portions of said first nitride layer portions from said source and drain regions, and removing any silicon dioxide from said gate polysilicon electrode exposed by removal of said second silicon nitride and silicon oxynitride layer portions therefrom, to expose the underlying contact surface of said gate polysilicon layer electrode defined thereby, and simultaneously removing said silicon dioxide layer from said source and drain region sources, thereby to provide a direct contact to said gate polysilicon layer electrode.

13. A process for fabricating a field effect semiconductor device having source, drain, and gate regions on a selected area of a first surface of a monocrystalline silicon substrate comprising the steps of:

thermally growing a silicon dioxide layer on said selected area of said first surface of a thickness suitable for the gate insulator layer of said field effect device, forming a first silicon nitride layer on said silicon dioxide layer, forming a first silicon oxynitride layer on said first silicon nitride layer, forming a polysilicon layer on said first silicon oxynitride layer, forming a protection layer on said polysilicon layer, said protection layer being substantially non-oxidizable by thermal oxidation and being removable by a material-selective removal process having no substantial effect on silicon and silicon dioxide surfaces, removing said protection layer except for retaining a gate contact surface defining portion thereof extending transversly of said selected area in the region of a gate to be defined, protecting said retained portion of said protection layer while delineating said polysilicon layer to define a gate polysilicon layer electrode extending transversly of said selected area of said active device of lesser width than and in alignment with said retained portion of said protection layer, said gate polysilicon layer electrode defining first and second remaining portions of said selected area corresponding to source and drain regions of said device, thermally oxidizing the surface of said gate polysilicon layer electrode while retaining said first silicon nitride and silicon oxynitride layers over said source and drain regions of said active device to prevent formation of any substantial amount of oxide thereon, removing said retained, protection layer portion from said gate polysilicon layer electrode and removing said first silicon oxynitride and silicon nitride layers from said source and drain regions, and removing any silicon dioxide from said gate polysilicon electrode exposed by removal of said protection layer portion therefrom, to expose the underlying contact surface of said gate polysilicon layer electrode defined by said protection layer portion, and simultaneously removing said silicon dioxide layer from said source and drain region sources, thereby to provide a direct contact to said gate polysilicon layer electrode.

14. A process as recited in claim 13 wherein said protection layer comprises a layer of silicon nitride.

15. A process for forming very large scale integrated circuits on a monocrystalline silicon semiconductor substrate having field oxide surrounding and isolating at least one selected area in which a field effect semiconductor device is to be formed and having at least one polysilicon line conductor disposed at least in part on said field oxide and for providing self-aligned contacts to at least the source and drain regions of said device and to said polysilicon line conductor at a selected location thereof, comprising the steps of:

thermally oxidizing the surface of said semiconductor substrate in said selected area to form a first silicon dioxide layer thereon, forming a first silicon nitride layer on said first silicon dioxide layer, forming a first silicon oxynitride layer on said first silicon nitride layer, forming a layer of polysilicon on said first silicon oxynitride layer and on said field oxide, forming a protective button on said polysilicon layer, juxtaposed over the location of the corresponding said polysilicon line conductor to be formed, and of lesser width and said line conductor, defining a polysilicon line conductor to be formed from said polysilicon layer in accordance with the said juxtaposed position of said button and defining a polysilicon gate electrode to be formed in said polysilicon layer, said gate electrode extending transversely and centrally of said selected area for said active device, delineating said polysilicon layer to provide said polysilicon line conductor and said polysilicon gate electrode, thermally oxidizing said polysilicon line conductor and said polysilicon gate electrode to form an insulating oxide on exposed surfaces thereof while said button prevents thermal oxidation of the line portion on which it is juxtaposed and said first silicon nitride and oxynitride layer prevent thermal oxidation of said source and drain regions, removing said button and said first silicon oxynitride and nitride layers overlying said source and drain regions of said device, removing the silicon dioxide layer portions exposed by removal of said first silicon oxynitride and nitride layers and removing any oxide on the surface of said polysilicon line conductor exposed by removal of said button, thereby to expose said contact surfaces of said source and drain regions and of said diffused conducting line.

16. A process as recited in claim 15, further comprising a step of providing conductor lines on said semiconductor substrate extending over said field oxide and onto said polysilicon line contact for providing electrical connection thereto.

17. A process as recited in claim 15, wherein said button comprises a silicon nitride layer, and said step of removing said button comprises applying a material to said substrate which selectively removes nitride and has no substantial affect on said insulating thermal oxide.

18. A process as in claims 6, 10, 12, 13, or 15, wherein said step of forming a layer of polysilicon comprises forming a layer of polysilicon having dopant ions therein.

19. A very large scale integrated circuit produced in accordance with the process of claims 1, 6, 10, or 15.

20. A field effect semiconductor device produced in accordance with the process of claims 12 or 13.

* * * * *